(12) United States Patent
Na et al.

(10) Patent No.: US 8,648,384 B2
(45) Date of Patent: Feb. 11, 2014

(54) LIGHT EMITTING DEVICE

(75) Inventors: Jongho Na, Seoul (KR); Hoonki Hong, Seoul (KR); Hyunkee Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/397,907

(22) Filed: Feb. 16, 2012

(65) Prior Publication Data

US 2012/0145993 A1    Jun. 14, 2012

(30) Foreign Application Priority Data

Jul. 25, 2011   (KR) .......................... 10-2011-0073631
Jul. 29, 2011   (KR) .......................... 10-2011-0075761

(51) Int. Cl.
*H01L 33/32* (2010.01)

(52) U.S. Cl.
USPC .................................. 257/101; 257/E33.031

(58) Field of Classification Search
USPC .................................. 257/101, 102, E33.031
See application file for complete search history.

(56) References Cited

U.S. PATENT DOCUMENTS

| | | | |
|---|---|---|---|
| 7,294,867 B2 * | 11/2007 | Akita et al. | 257/103 |
| 2001/0045564 A1 * | 11/2001 | Koike et al. | 257/88 |
| 2004/0051105 A1 * | 3/2004 | Tsuda et al. | 257/79 |
| 2004/0051107 A1 * | 3/2004 | Nagahama et al. | 257/79 |
| 2005/0056824 A1 * | 3/2005 | Bergmann et al. | 257/14 |
| 2006/0192218 A1 * | 8/2006 | Kyono et al. | 257/96 |
| 2011/0309328 A1 * | 12/2011 | Kyono et al. | 257/13 |

* cited by examiner

*Primary Examiner* — Steven J Fulk
(74) *Attorney, Agent, or Firm* — KED & Associates, LLP

(57) ABSTRACT

A light emitting device is disclosed. In the light emitting device, the structure of a barrier layer of an active layer is changed, and a band gap energy of an intermediate layer is varied, thereby improving hole injection efficiency of the active layer and thus light emission efficiency.

14 Claims, 15 Drawing Sheets

LIGHT EMITTING DEVICE

CROSS-REFERENCE TO RELATED APPLICATION

This application claims the priority benefit of Korean Patent Application No. 10-2011-0073631, filed on Jul. 25, 2011 and Korean Patent Application No. 10-2011-0075761, filed on Jul. 29, 2011 in the Korean Intellectual Property Office, the disclosure of which is incorporated herein by reference.

BACKGROUND

1. Field

Embodiments relate to a light emitting device.

2. Description of the Related Art

A light emitting diode (LED) is a device that converts an electrical signal into infrared light, visible light or other forms of light using the properties of a compound semiconductor. The LED is used in electric home appliances, remote controllers, electric bulletin boards, displays, various kinds of automated equipment, etc. The application range of LEDs continues to expand.

Generally, a miniaturized LED is formed of a surface mount device type so that the LED is directly mounted on a printed circuit board (PCB). As a result, an LED lamp, using as a display device, has been developed to have a surface mount device type structure. The surface mount device may replace an existing simple lighting lamp. The surface mount device may be used as various colored lighting displays, text displays, image displays, etc.

As the application range of LEDs expands, lamps for home use and lamps for rescue signals require high brightness. Consequently, it is necessary to improve brightness of LEDs.

SUMMARY

Embodiments provide a light emitting device with improved light emission efficiency and reduced crystal defects.

In one embodiment, a light emitting device includes a light emitting structure including a first semiconductor layer, a second semiconductor layer, and an active layer disposed between the first semiconductor layer and the second semiconductor layer, wherein the first semiconductor layer is an N type semiconductor layer doped with an N type dopant, the second semiconductor layer is a P type semiconductor layer doped with a P type dopant, the active layer comprises at least one pairs of alternately stacked well layers and barrier layers, one of the barrier layers adjacent to the second semiconductor layer comprises a first layer and a second layer disposed between the first layer and the second semiconductor layer, the first layer has a first band gap, the second layer has a second band gap, the second band gap is less than the first band gap, and the second layer is doped with a P type dopant.

BRIEF DESCRIPTION OF THE DRAWINGS

Details of embodiments will be more clearly understood from the following detailed description taken in conjunction with the accompanying drawings, in which.

DETAILED DESCRIPTION OF EMBODIMENTS

Figure 1:
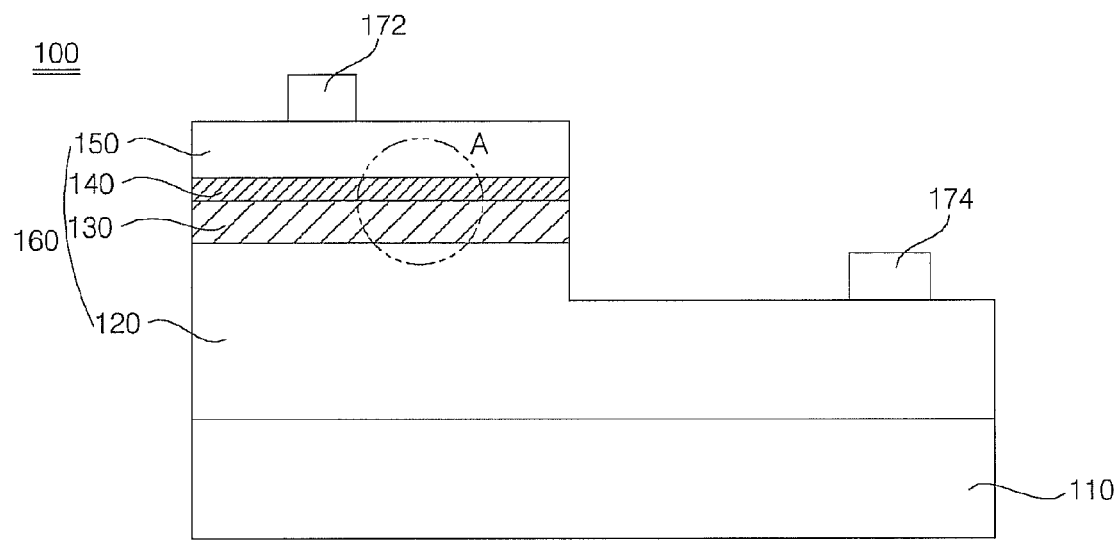
FIG. 1 is a view showing a light emitting device according to an embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Referring to FIG. 1, a light emitting device 100 may include a support member 110 and a light emitting structure 160 disposed on the support member 110. The light emitting structure 160 may include a first semiconductor layer 120, an active layer 130, an intermediate layer 140, and a second semiconductor layer 150.

The support member 110 may be formed of at least one selected from among sapphire ($Al_2O_3$), GaN, ZnO and AlO; however, the disclosure is not limited thereto. Also, the support member 110 may be a SiC support member which exhibits higher thermal conductivity than a sapphire ($Al_2O_3$) support member. However, the support member 110 may have a refractive index lower than that of the first semiconductor layer 120 to improve light extraction efficiency.

Meanwhile, a patterned substrate (PSS) structure may be provided at the upper side surface of the support member 110. The support member mentioned in this specification may have such a PSS pattern or not.

Meanwhile, a buffer layer (not shown) may be positioned on the support member 110 to reduce lattice mismatch between the support member 110 and the first semiconductor layer 120 and easily grow the semiconductor layer. The buffer layer (not shown) may be formed under a low temperature atmosphere and may be formed of a material that can reduce the difference of a lattice constant between the semiconductor layer and the support member. For example, the buffer layer (not shown) may be formed of any one selected from among GaN, InN, AlN, AlInN, InGaN, AlGaN and InAlGaN; however, the disclosure is not limited thereto. The buffer layer (not shown) may grow on the support member 110 in a single crystal form. The buffer layer (not shown) grown in the single crystal form may improve crystallinity of the first semiconductor layer 120 grown on the buffer layer (not shown).

The light emitting structure 160, including the first semiconductor layer 120, the active layer 130, and the second semiconductor layer 150, may be formed on the buffer layer (not shown).

The first semiconductor layer 120 may be disposed on the buffer layer (not shown). The first semiconductor layer 120 may be realized as an n type semiconductor layer. The first semiconductor layer 120 may supply electrons to the active layer 130. The first semiconductor layer 120 may be formed of a semiconductor material, such as GaN, AlN, AlGaN, InGaN, InN, InAlGaN or AlInN, having a formula of, for example, $In_xAl_yGa_{1-x-y}N$ ($0 \leq x \leq 1$, $0 \leq y \leq 1$, $0 \leq x+y \leq 1$) and may be doped with an n type dopant, such as Si, Ge or Sn.

Also, an undoped semiconductor layer (not shown) may be disposed under the first semiconductor layer 120; however, the disclosure is not limited thereto. The undoped semiconductor layer is formed to improve crystallinity of the first semiconductor layer 120. The undoped semiconductor layer is not doped with an n type dopant, and therefore, the undoped semiconductor layer may be the same as the first semiconductor layer 120 except that the undoped semiconductor layer exhibits electrical conductivity lower than that of the first semiconductor layer 120.

The active layer 130 may be formed on the first semiconductor layer 120. The active layer 130 may be formed of a group III-V compound semiconductor material. The active layer 130 may be configured to have a single or multi quantum well structure, a quantum wire structure or a quantum dot structure.

If the active layer 130 is configured to have a quantum well structure, the active layer 130 may have a single or multi quantum well layer structure including a well layer having a formula of $In_xAl_yGa_{1-x-y}N$ ($0 \leq x \leq 1$, $0 \leq y \leq 1$, $0 \leq x+y \leq 1$) and a barrier layer having a formula of $In_aAl_bGa_{1-a-b}N$ ($0 \leq a \leq 1$, $0 \leq b \leq 1$, $0 \leq a+b \leq 1$). The well layer may be formed of a material having a band gap less than that of the barrier layer.

Also, if the active layer 130 is configured to have a multi quantum well structure, well layers (not shown) or barrier walls (not shown) may have different compositions or different band gaps, which will be described below with reference to FIGS. 2 and 3.

A conductive clad layer (not shown) may be formed on and/or under the active layer 130. The conductive clad layer (not shown) may be formed of an AlGaN semiconductor and may have a band gap greater than that of the active layer 130.

The second semiconductor layer 150 may be realized as a p type semiconductor layer, which injects holes into the active layer 130. The second semiconductor layer 150 may be formed of a semiconductor material, such as GaN, AlN, AlGaN, InGaN, InN, InAlGaN or AlInN, having a formula of, for example, $In_xAl_yGa_{1-x-y}N$ ($0 \leq x \leq 1$, $0 \leq y \leq 1$, $0 \leq x+y \leq 1$) and may be doped with a p type dopant, such as Mg, Zn, Ca, Sr or Ba.

Meanwhile, the intermediate layer 140 may be formed between the active layer 130 and the second semiconductor layer 150. The intermediate layer 140 may be an electron blocking layer to prevent the flow of electrons, injected from the first semiconductor layer 120 into the active layer 130, to the second semiconductor layer 150 without recombination thereof in the active layer 130 upon application of high current. The intermediate layer 140 may have a band gap greater than that of the active layer 130 to prevent the injection of electrons, injected from the first semiconductor layer 120, into the second semiconductor layer 150 without recombination thereof in the active layer 130, thereby increasing provability of recombination between electrons and holes and preventing current leakage.

Meanwhile, the intermediate layer 140 may have a band gap greater than that of the barrier layer included in the active layer 130. The intermediate layer 140 may be formed of a semiconductor layer including Al like a p type AlGaN; however, the disclosure is not limited thereto.

The first semiconductor layer 120, the active layer 130, the intermediate layer 140, and the second semiconductor layer 150 may be formed by metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE) or sputtering; however, the disclosure is not limited thereto.

Also, the conductive dopants in the first semiconductor layer 120 and the second semiconductor layer 150 may have uniform or non-uniform doped concentrations. That is, a plurality of semiconductors may be formed to have various doped concentrations; however, the disclosure is not limited thereto.

Also, the first semiconductor layer 120 may be realized as a p type semiconductor layer, the second semiconductor layer 150 may be realized as an n type semiconductor layer, and a third semiconductor layer (not shown) including an n type or p type semiconductor layer may be formed on the second semiconductor layer 150. As a result, the light emitting device 100 may have at least one selected from among np, pn, npn and pnp junction structures.

Meanwhile, the active layer 130 and the second semiconductor layer 150 may be partially removed to expose a portion of the first semiconductor layer 120, and a first electrode 174 may be formed on the exposed portion of the first semiconductor layer 120. That is, the first semiconductor layer 120 may has an upper surface facing the active layer 130 and a lower surface facing the support member 110. The upper surface of the first semiconductor layer 120 may includes at least partially exposed portion, and the first electrode 174 may be disposed on the exposed portion of the first semiconductor layer 120 at the upper surface thereof.

Meanwhile, a portion of the first semiconductor layer 120 may be exposed using a predetermined etching method; however, the disclosure is not limited thereto. Wet etching or dry etching may be used as the etching method.

Also, a second electrode 172 may be formed on the second semiconductor layer 150.

Meanwhile, the first and second electrode 174 and 172 may be formed of an conductive material, such as In, Co, Si, Ge, Au, Pd, Pt, Ru, Re, Mg, Zn, Hf, Ta, Rh, Ir, W, Ti, Ag, Cr, Mo, Nb, Al, Ni, Cu, WTi or an alloy thereof, and may be formed to have a single layer or a plurality of layers; however, the disclosure is not limited thereto.

Figure 2:
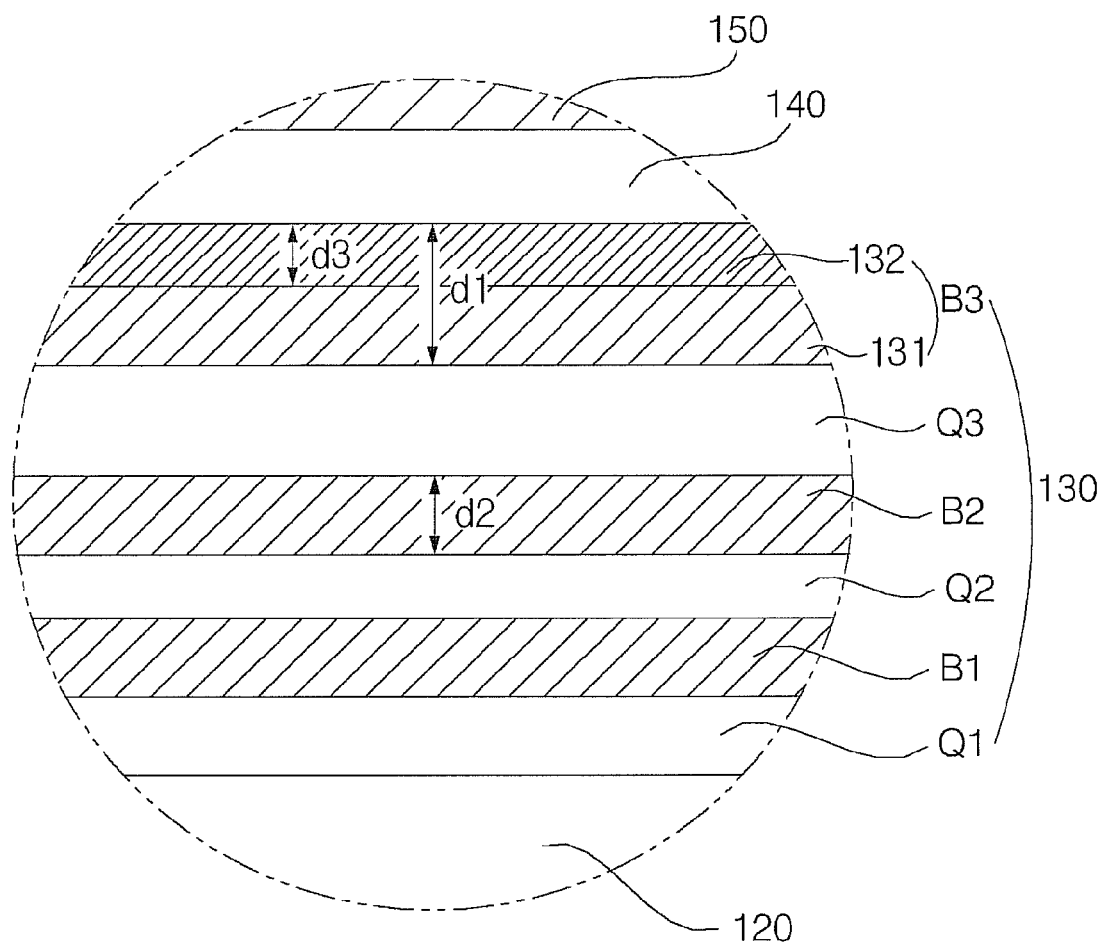
FIG. 2 is a partially enlarged sectional view of the light emitting device according to the embodiment.

FIG. 2 is an enlarged sectional view of a region A of FIG. 1.

Referring to FIG. 2, the active layer 130 of the light emitting device 100 may have a multi quantum well structure. Consequently, the active layer 130 may include first to third well layers Q1, Q2 and Q3 and first to third barrier layers B1, B2 and B3.

According to embodiments, the first to third well layers Q1, Q2 and Q3 and the first to third barrier layers B1, B2 and B3 may be alternately stacked as shown in FIG. 2.

In FIG. 2, the first to third well layers Q1, Q2 and Q3 and the first to third barrier layers B1, B2 and B3 are formed so that the first to third well layers Q1, Q2 and Q3 and the first to third barrier layers B1, B2 and B3 are alternately stacked; however, the disclosure is not limited thereto. The number of the well layers and the barrier layers may be varied, and the well layers Q1, Q2 and Q3 and the barrier layers B1, B2 and B3 may be arbitrarily arranged. In addition, the materials for the well layers Q1, Q2 and Q3 and the barrier layers B1, B2 and B3 may have different composition ratios, and the well layers Q1, Q2 and Q3 and the barrier layers B1, B2 and B3 may have different band gaps and thicknesses. That is, the composition ratios of the materials for the well layers Q1, Q2 and Q3 and the barrier layers B1, B2 and B3 and the band gaps and thicknesses of the well layers Q1, Q2 and Q3 and the barrier layers B1, B2 and B3 are not limited as shown in FIG. 2.

Also, according to embodiments, the third barrier layer B3 formed adjacent to the second semiconductor layer 150 may have a thickness d1, and the second barrier layer B2 may have a thickness d2. Here, d1 may be greater than d2.

Meanwhile, the barrier layer (for example, the third barrier layer B3) adjacent to the second semiconductor layer 150 may include a first layer 131 and a second layer 132 disposed between the first layer 131 and the second semiconductor layer 150.

The first layer 131 and the second layer 132 may have different growth conditions, thicknesses or compositions; however, the disclosure is not limited thereto. For example, the second layer 132 may have In content greater than that of the first layer 131 and less than that of each of the well layers. The first layer has a thickness of 4 nm to 6 nm.

Meanwhile, the second layer 132 may be doped with a p type dopant such as Mg. The second layer has a concentration of the Mg of 1E19 atoms/cm$^3$ to 5E19 atoms/cm$^3$. As the second layer 132 is doped with such a p type dopant, hole injection efficiency may be improved, and operating voltage may be lowered. The thickness of the second layer 132 is greater than those of the well layers Q1, Q2 and Q3.

Meanwhile, the second layer 132 may have a predetermined thickness d3 to increase hole capture probability. For example, the second layer 132 may have a thickness of 2 nm to 15 nm.

Also, the first layer 131 and the second layer 132 may be formed so as to have different band gaps, which will be hereinafter described with reference to FIG. 3.

Figure 3:
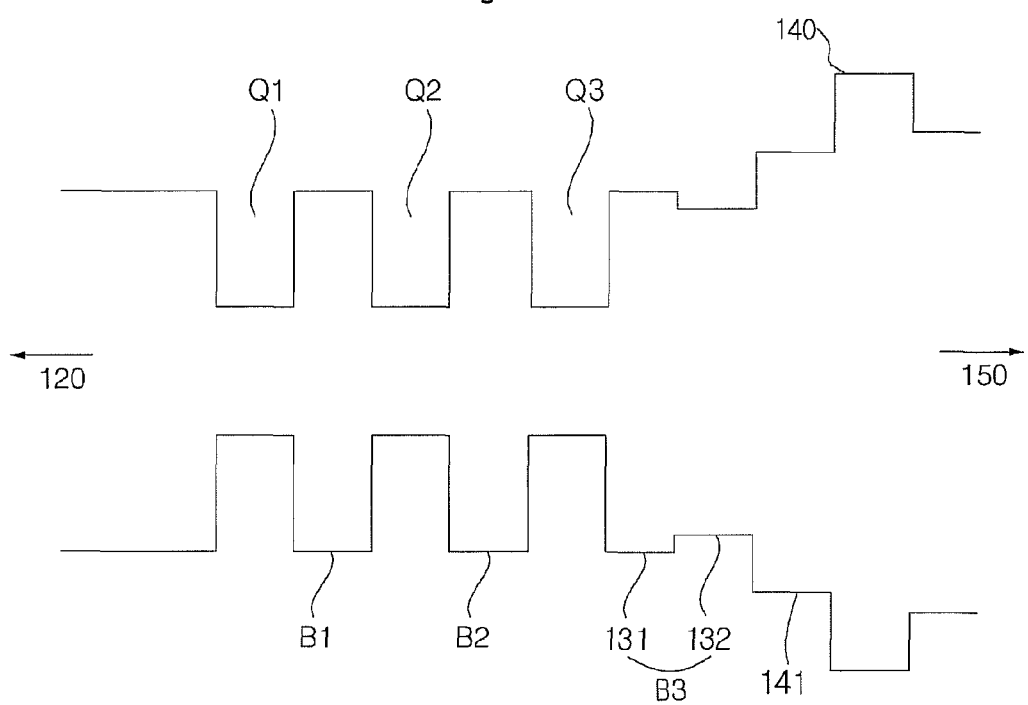
FIG. 3 is a view showing an energy band diagram of the light emitting device according to the embodiment.

FIG. 3 is a view showing an energy band diagram of the light emitting device according to the embodiment.

Referring to FIG. 3, the first layer 131 and the second layer 132 of the third barrier layer B3 may have different band gaps. For example, the band gap of the second layer 132 may be formed to have a cart structure, by which the band gap of the second layer 132 is less than that of the first layer 131. Also, the band gap of the second layer 132 may be less than that of each of the first and second barrier layers B1 and B2 and that of the first layer 131 of the third barrier layer B3 and greater than that of each of the well layers Q1, Q2 and Q3.

Meanwhile, if the thicknesses of the well layers Q1, Q2 and Q3, functioning as light emitting layers, are increased, carrier capture probability may be increased. However, if the thicknesses of the well layers Q1, Q2 and Q3 are increased, the quantum well structure may be deeply distorted due to piezoelectric polarization with the result that internal quantum efficiency is lowered and red shift of a light emitting spectrum occurs, thereby deteriorating electrical and optical properties of the light emitting device to emit light through recombination between electrons and holes.

Meanwhile, the well layers Q1, Q2 and Q3 may have a formula of $In_xAl_yGa_{1-x-y}N$ ($0 \leq x \leq 1$, $0 \leq y \leq 1$, $0 \leq x+y \leq 1$) and the barrier layers B1, B2 and B3 may have a formula of $In_aAl_bGa_{1-a-b}N$ ($0 \leq a \leq 1$, $0 \leq b \leq 1$, $0 \leq a+b \leq 1$). The well layers Q1, Q2 and Q3 may have a thickness of 2 nm to 10 nm. the barrier layers B1, B2 and B3 may have a thickness of 2 nm to 10 nm.

In the light emitting device 100 according to the embodiment, one portion of each of the barrier layers B1, B2 and B3, not functioning as light emitting layers, may be formed so as to have a band gap less than the other portion of each of the barrier layers B1, B2 and B3 and to have a cart structure contributing to capture of carriers. As a result, carrier injection efficiency may be improved without poor spectrum of light and curve of bands generated in the well layers Q1, Q2 and Q3. Consequently, carrier injection efficiency may be improved, and probability of recombination between holes and electrons may be increased, thereby improving light emission efficiency of the light emitting device 100.

Meanwhile, holes have lower mobility than electrons. For this reason, the electrons may be excessively injected as compared with the holes (an excessive electron injection phenomenon). Also, the electrons may flow to the second semiconductor layer 140 over the active layer 130 (an overflowing phenomenon).

In the light emitting device 100 according to the embodiment, the third barrier layer B3 adjacent to the second semiconductor layer 150 doped with the p type dopant may be formed to have a cart structure, thereby increasing capture probability of carriers, e.g. holes, supplied from the second semiconductor layer 150. Consequently, probability of recombination between electrons and holes may be increased, and an overflowing phenomenon, in which electrons supplied from the first semiconductor layer 120 flows to the second semiconductor layer 150 due to excessive injection of the electrons, may be prevented, thereby improving light emission efficiency of the light emitting device 100.

Meanwhile, undoped $Al_yGa_{1-y}N$ (0<x≤1) 141 may be disposed between the active layer 130 and the intermediate layer 140. Undoped $Al_yGa_{1-y}N$ (0<x≤1) 141 may be disposed between the active layer 130 and the second semiconductor layer 150. The band gap of the undoped $Al_yGa_{1-y}N$ (0<x≤1) 141 may greater than the first band gap. The undoped $Al_yGa_{1-y}N$ (0<x≤1) 141 may reduce lattice mismatch between the active layer 130 and the intermediate layer 140.

Figure 4:
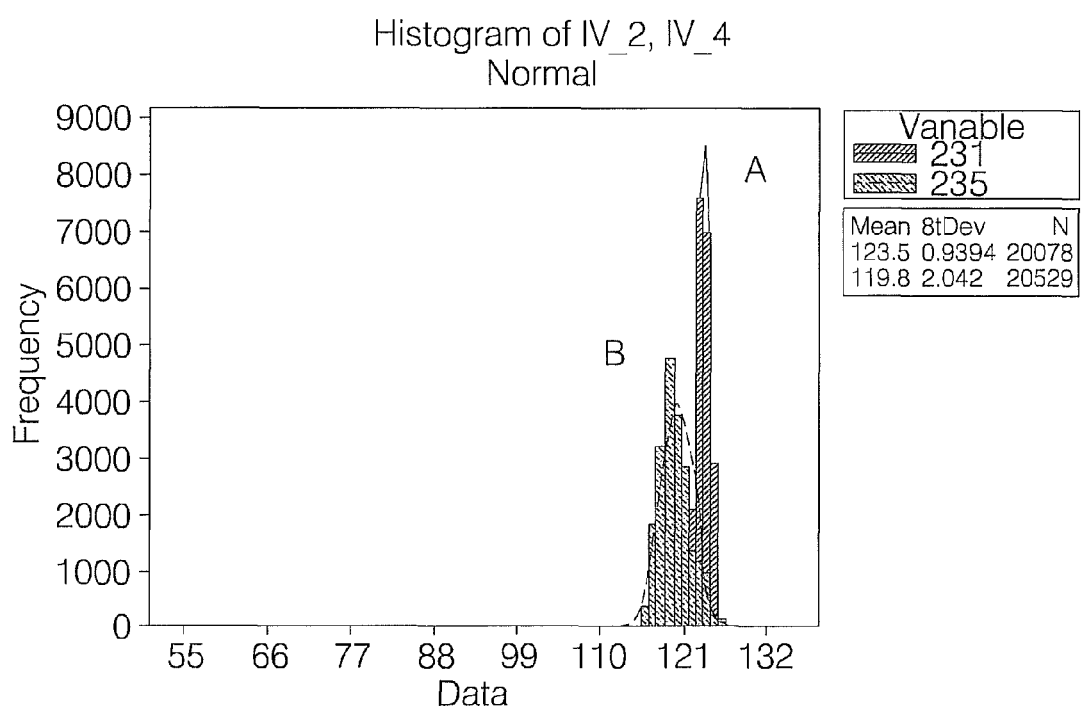
FIG. 4 is a view showing the difference of luminous intensity between a conventional light emitting device and the light emitting device according to the embodiment.

FIG. 4 is a view showing the comparison of luminous intensity between a conventional light emitting device and the light emitting device according to the embodiment.

Referring to FIG. 4, the light emitting device according to the embodiment (A) includes the barrier layer configured to have the cart structure as described above, hole injection efficiency is improved, and probability of recombination between holes and electrons is increased. Consequently, it can be seen that luminous intensity of the light emitting device according to the embodiment (A) is higher than that of the conventional light emitting device (B).

Figure 5:
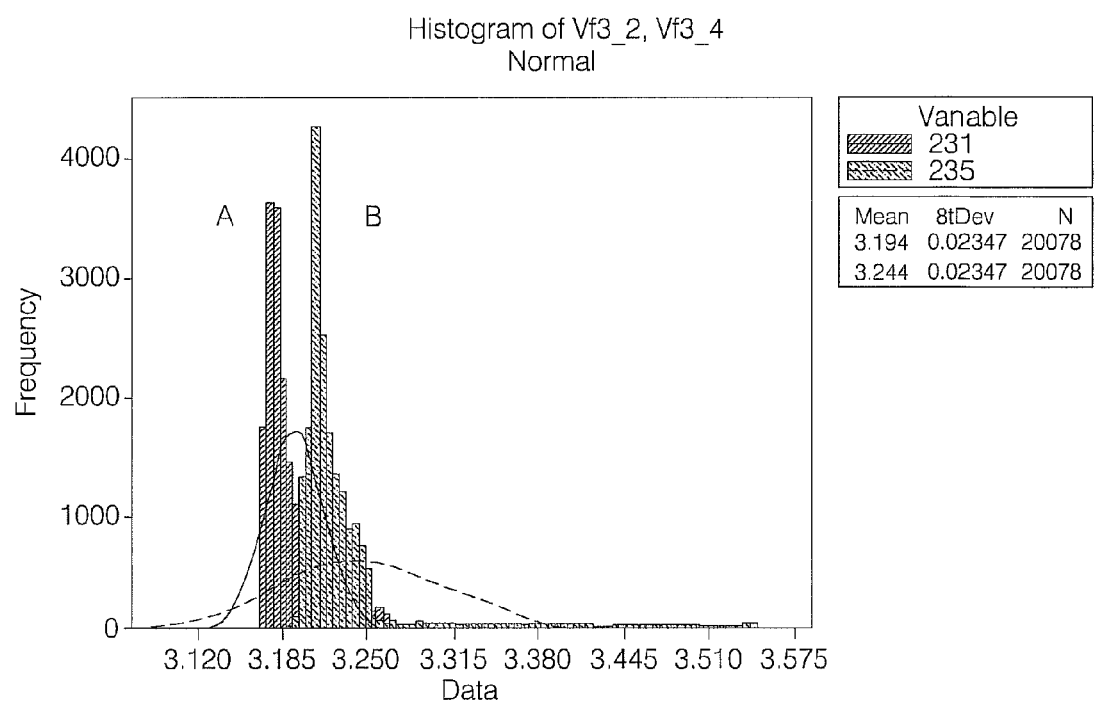
FIG. 5 is a view showing the difference of operating voltage between the conventional light emitting device and the light emitting device according to the embodiment.

FIG. 5 is a view showing the comparison of operating voltage between the conventional light emitting device and the light emitting device according to the embodiment.

Referring to FIG. 5, the light emitting device according to the embodiment (A) includes the barrier layer configured to have the cart structure as described above, and the barrier layer having the cart structure is doped with a dopant, such as Mg. Consequently, it can be seen that operating voltage of the light emitting device according to the embodiment (A) is lower than that of the conventional light emitting device (B).

Figure 6:
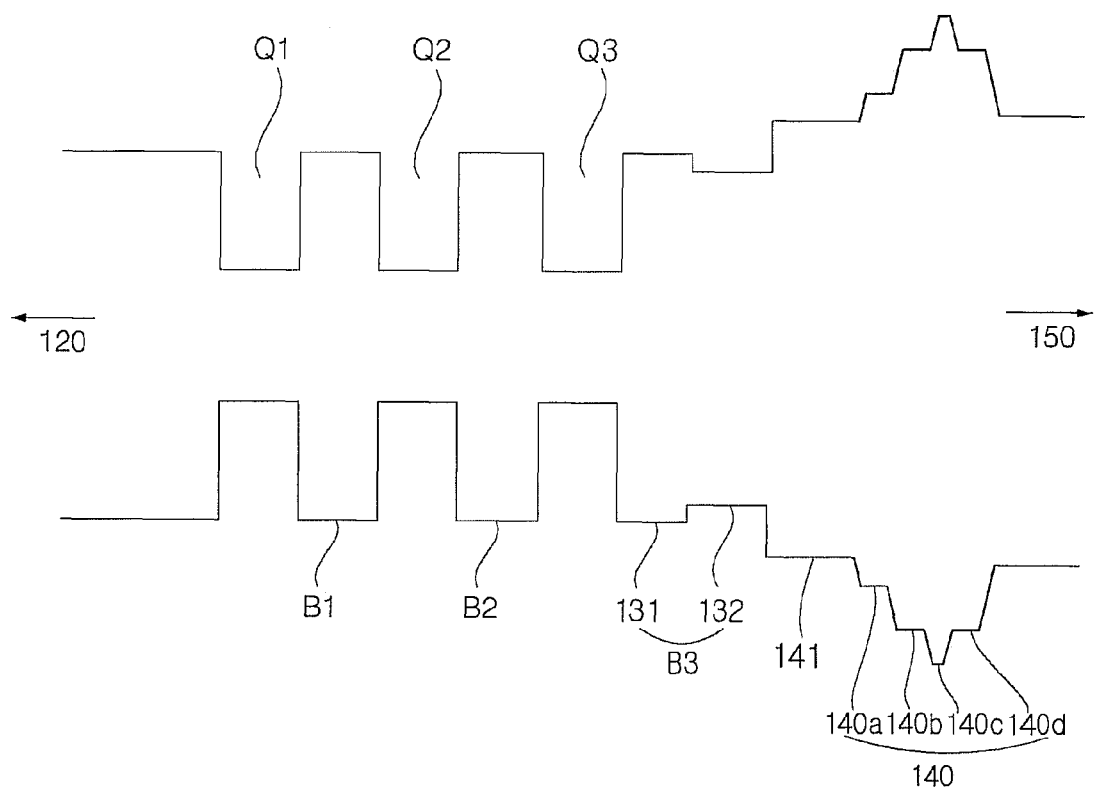
FIG. 6 is a view showing an energy band diagram of a light emitting device according to another embodiment.
Figure 7:
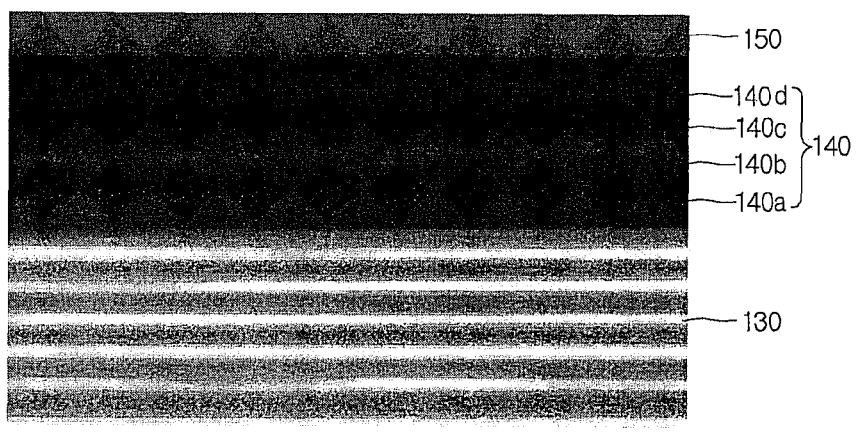
FIG. 7 is a view showing a transmission electron microscopy (TEM) picture of an intermediate layer of the light emitting device according to the embodiment.

FIG. 6 is a view showing an energy band diagram of a light emitting device according to another embodiment, and FIG. 7 is a view showing a transmission electron microscopy (TEM) picture of an intermediate layer of the light emitting device according to the embodiment.

Referring to FIG. 6, the light emitting device 100 according to the embodiment is different from the light emitting device according to the embodiment of FIG. 3 in that band gap of the intermediate layer 140 of the light emitting device 100 according to the embodiment is different from that of the intermediate layer 140 of the light emitting device according to the embodiment of FIG. 3.

The intermediate layer 140 may include a p type doped p-$Al_xGa_{1-x}N$ (0<x≤1). For example, Mg having a concentration of approximately $10^{18}$ to $10^{20}/cm^3$ may be ion-injected into the intermediate layer 140 to efficiently block overflowing electrons and improve hole injection efficiency.

Also, in the light emitting device according to the embodiment, Al composition of the intermediate layer 140 may be varied. For example, in the light emitting device according to the embodiment, Al composition of the intermediate layer 140 may be increased and then decreased from the active layer 130 to the second semiconductor layer 150.

Also, in the light emitting device according to the embodiment, Al composition of the intermediate layer 140 may be gradually increased and then gradually decreased from the active layer 130 to the second semiconductor layer 150.

According to the embodiment, the initial Al composition ratio of the intermediate layer 140 may be lowered to minimize the difference of a lattice constant between the intermediate layer 140 and the active layer, thereby relaxing strain and improving hole injection efficiency.

Also, in the light emitting device according to the embodiment, the Al composition ratio of the last intermediate layer 140 adjacent to the second semiconductor layer 150 may be lowered to lower an energy band level, thereby improving hole injection efficiency.

Also, in the light emitting device according to the embodiment, the intermediate layer 140 may have a specific thickness, and the Al composition ratio of the intermediate layer 140 may be gradually varied, thereby improving electron blocking efficiency and hole injection efficiency. For example, the intermediate layer 140 may have a thickness of approximately 300 Å to approximately 600 Å, thereby improving electron blocking efficiency and hole injection efficiency.

Also, the intermediate layer 140 may be a bulk layer as shown in FIG. 6, and a plurality of regions having different Al compositions may be provided in the bulk layer.

For example, the intermediate layer 140 may have approximately 4 or approximately 5 stairs in which the Al composition ratio is varied between approximately 5% and approximately 30%; however, the disclosure is not limited thereto.

For example, the intermediate layer 140 may have a first region 140a, a second region 140b, a third region 140c, and a fourth region 140d which have different Al compositions. The Al composition of the first region 140a may be approximately 10%, the Al composition of the second region 140b may be approximately 18%, the Al composition of the third region 140c may be approximately 30%, and the Al composition of the fourth region 140d may be approximately 18%; however, the disclosure is not limited thereto.

The first region 140a may have a thickness of approximately 120 nm, the first region 140b may have a thickness of approximately 150 nm, the third region 140c may have a thickness of approximately 60 nm, and the fourth region 140d may have a thickness of approximately 120 nm; however, the disclosure is not limited thereto.

According to the embodiment, the Al composition ratio of the first region 140a of the intermediate layer 140 may be lowered to minimize the difference of a lattice constant between the first region 140*a* of the intermediate layer 140 and the active layer 130, thereby relaxing strain and improving hole injection efficiency.

Also, in the light emitting device according to the embodiment, the Al composition ratio of the fourth region 140*d* of the last intermediate layer 140 adjacent to the second semiconductor layer 150 may be lowered to lower an energy band level, thereby improving hole injection efficiency.

In the light emitting device according to the embodiment, the intermediate layer 140 may be a bulk layer as shown in FIG. 6.

Referring to FIG. 7, the contrast ratio may be increased as the Al composition ratio is increased. As can be clearly seen from the TEM, the Al composition of the intermediate layer 140 is graded.

According to the embodiment, the intermediate layer 140 is a bulk layer, thereby reducing processing time as compared with an electron blocking layer configured to have a superlattice structure and thus improving productivity.

Also, according to the embodiment, the Al composition ratio of the intermediate layer 140 is varied with the result that the energy band gaps of the respective layer are varied, thereby improving electron blocking efficiency using a piezo field.

Also, according to the embodiment, the Al composition ratio of the intermediate layer 140, as the bulk layer, is varied, thereby relaxing strain and improving hole injection efficiency.

Also, in the light emitting device according to the embodiment, the intermediate layer 140 is doped with In with the result that pits may be merged into a p-$Al_xGa_{1-x}N$ electron blocking layer, which is grown after the active layer, and hole injection efficiency may be improved through the addition of In.

In the light emitting device according to the embodiment, undoped $Al_yGa_{1-y}N$ ($0<y\leq1$) 135 may be disposed between the active layer 130 and the intermediate layer 140 as shown in FIG. 2.

For example, undoped $Al_yGa_{1-y}N$ ($0<y\leq1$) of approximately 60 Å or less may be formed between the active layer 130 and the intermediate layer 140, thereby relaxing strain and improving hole injection efficiency.

Also, in the light emitting device according to the embodiment, the second semiconductor layer 150 may be configured to have a p-bump structure in which Mg doped concentration of is increased, thereby reducing contact resistance between the second semiconductor layer 150 and an electrode layer, which will be formed later.

Embodiments may provide a high power light emitting device, a method of manufacturing such a light emitting device, a light emitting device package, and a lighting system.

Also, embodiments may provide a high power light emitting device including an electron blocking layer exhibiting an excellent electron blocking function to improve hole injection efficiency, a method of manufacturing such a light emitting device, a light emitting device package, and a lighting system.

Figure 8:
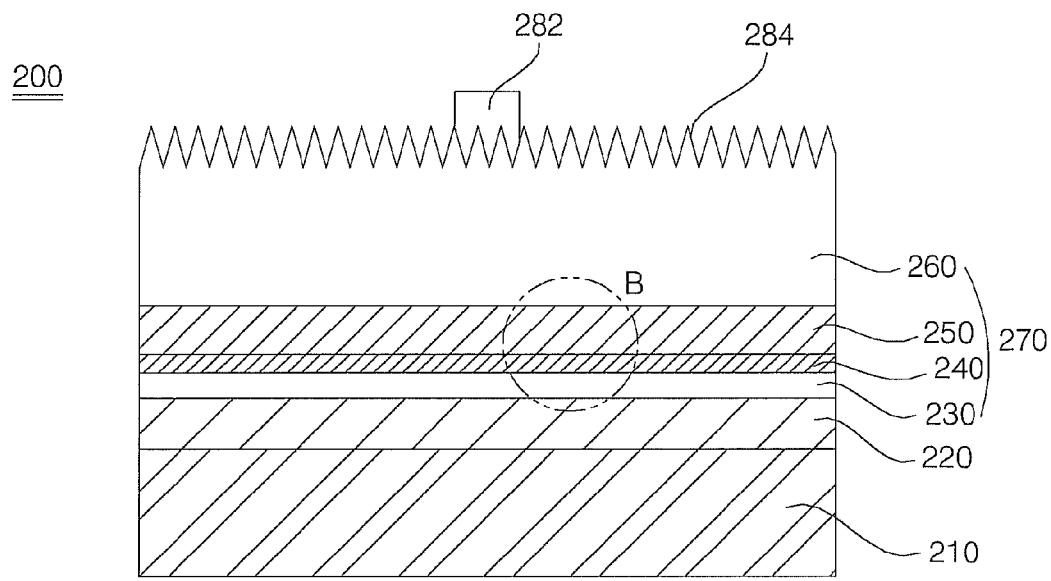
FIG. 8 is a view showing a light emitting device according to another embodiment.

FIG. 8 is a view showing a light emitting device 200 according to another embodiment Referring to FIG. 8, the light emitting device 200 according to the embodiment may include a support member 210, a light emitting structure 270 including a first electrode layer 220 disposed on the support member 210, a second semiconductor layer 230, an active layer 250 and a first semiconductor layer 260, and a second electrode layer 282.

The support member 210 may be formed of a material exhibiting high thermal conductivity or a conductive material. For example, the support member 210 may be formed of a metallic material or conductive ceramic. The support member 210 may be formed to have a single layer, a dual layer or a multiple layer.

That is, the support member 210 may be formed of Au, Ni, W, Mo, Cu, Al, Ta, Ag, Pt, Cr or an alloy thereof. Alternatively, the support member 210 may be formed by stacking two or more different materials. Also, the support member 210 may be realized as a carrier wafer, such as Si, Ge, GaAs, ZnO, SiC, SiGe, GaN or $Ga_2O_3$. The support member 210 may easily dissipate heat generated from the light emitting device 200, thereby improving thermal stability of the light emitting device 200.

Meanwhile, the first electrode layer 220 may be formed on the support member 210. The first electrode layer 220 may include at least one selected from among an ohmic layer (not shown), a reflective layer (not shown) and a bonding layer (not shown). For example, the first electrode layer 220 may have a structure including an ohmic layer, a reflective layer and a bonding layer, a stacked structure including an ohmic layer and a reflective layer, or a structure including and a reflective layer (including an ohmic layer) and a bonding layer; however, the disclosure is not limited thereto. For example, the first electrode layer 220 may be configured to have a structure in which a reflective layer and an ohmic layer are sequentially stacked on a dielectric layer.

The reflective layer (not shown) may be disposed between the ohmic layer (not shown) and the bonding layer (not shown). The reflective layer (not shown) may be formed of a material exhibiting high reflexibility, such as Ag, Ni, Al, Rh, Pd, Ir, Ru, Mg, Zn, Pt, Au, Hf or a selective combination thereof. Alternatively, the reflective layer (not shown) may be formed to have a multiple layer including the above-mentioned metallic materials and light transmitting conductive materials, such as IZO, IZTO, IAZO, IGZO, IGTO, AZO and ATO. Also, the reflective layer (not shown) may be formed to have a stacked structure of IZO/Ni, AZO/Ag, IZO/Ag/Ni or AZO/Ag/Ni. Also, when the reflective layer (not shown) is formed of a material that comes into ohmic contact with the light emitting structure 270 (for example, the second semiconductor layer 230), the ohmic layer (not shown) may not be additionally formed; however, the disclosure is not limited thereto.

The ohmic layer (not shown) may come into ohmic contact with the lower surface of the light emitting structure 270 and may be formed to have a plurality of layers or a plurality of patterns. The ohmic layer (not shown) may be formed of a light transmitting electrode layer and a metal, which may be selectively used. For example, the ohmic layer (not shown) may be formed of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni, Ag, Ni/$IrO_x$/Au and Ni/$IrO_x$/Au/ITO, and may be formed to have a single layer or a plurality of layers. The ohmic layer (not shown) is provided to smoothly inject carriers into the second semiconductor layer 230l; however, the ohmic layer (not shown) is not necessarily needed.

Also, the first electrode layer 220 may include the bonding layer (not shown). The bonding layer (not shown) may be formed of a barrier metal or a bonding metal. For example, the bonding layer (not shown) may be formed of at least one selected from among Ti, Au, Sn, Ni, Cr, Ga, In, Bi, Cu, Ag and Ta; however, the disclosure is not limited thereto.

The light emitting structure 270 may include at least the second semiconductor layer 230, the active layer 250 and the first semiconductor layer 260. The active layer 250 may be disposed between the second semiconductor layer 230 and the first semiconductor layer 260.

The second semiconductor layer 230 may be formed on the first electrode layer 220. The second semiconductor layer 230 may be realized as a p type semiconductor layer doped with a p type dopant. The p type semiconductor layer may be formed of a semiconductor material, such as GaN, AlN, AlGaN, InGaN, InN, InAlGaN or AlInN, having a formula of $In_xAl_yGa_{1-x-y}N$ ($0 \le x \le 1$, $0 \le y \le 1$, $0 \le x+y \le 1$) and may be doped with a p type dopant, such as Mg, Zn, Ca, Sr or Ba.

The active layer 250 may be formed on the second semiconductor layer 230. The active layer 250 may be formed of a group III-V compound semiconductor material. The active layer 250 may be configured to have a single or multi quantum well structure, a quantum wire structure or a quantum dot structure.

If the active layer 250 is configured to have a quantum well structure, the active layer 250 may have a single or multi quantum well layer structure including a well layer having a formula of $In_xAl_yGa_{1-x-y}N$ ($0 \le x \le 1$, $0 \le y \le 1$, $0 \le x+y \le 1$) and a barrier layer having a formula of $In_aAl_bGa_{1-a-b}N$ ($0 \le a \le 1$, $0 \le b \le 1$, $0 \le a+b \le 1$). The well layer may be formed of a material having a band gap less than that of the barrier layer.

A conductive clad layer (not shown) may be formed on and/or under the active layer 250. The conductive clad layer (not shown) may be formed of an AlGaN semiconductor and may have a band gap greater than that of the active layer 250.

Also, if the active layer 250 is configured to have a multi quantum well structure, well layers (not shown) or barrier walls (not shown) may have different compositions or different band gaps, which will be described below with reference to FIGS. 9 and 10.

Meanwhile, an intermediate layer 240 may be formed between the active layer 250 and the second semiconductor layer 230. The intermediate layer 240 may be an electron blocking layer to prevent the flow of electrons, injected from the first semiconductor layer 260 into the active layer 250, to the second semiconductor layer 230 without recombination thereof in the active layer 250 upon application of high current. The intermediate layer 240 may have a band gap greater than that of the active layer 250 to prevent the injection of electrons, injected from the first semiconductor layer 260, into the second semiconductor layer 230 without recombination thereof in the active layer 250, thereby increasing provability of recombination between electrons and holes in the active layer 250 and preventing current leakage.

Meanwhile, the intermediate layer 240 may have a band gap greater than that of the barrier layer included in the active layer 250. The intermediate layer 240 may be formed of a semiconductor layer including Al like a p type AlGaN; however, the disclosure is not limited thereto.

The first semiconductor layer 260 may be formed on the active layer 250. The first semiconductor layer 260 may be realized as an n type semiconductor layer. The n type semiconductor layer may be formed of a semiconductor material, such as GaN, AlN, AlGaN, InGaN, InN, InAlGaN or AlInN, having a formula of, for example, $In_xAl_yGa_{1-x-y}N$ ($0 \le x \le 1$, $0 \le y \le 1$, $0 \le x+y \le 1$) and may be doped with an n type dopant, such as Si, Ge, Sn, Se or Te.

The second electrode layer 282 may be formed on the first semiconductor layer 260 so that the second electrode layer 282 is electrically connected to the first semiconductor layer 260. The second electrode layer 282 may include at least one pad and/or an electrode having a predetermined pattern. The second electrode layer 282 may be disposed at a central region, an outside region or a corner region of the first semiconductor layer 260 at the upper surface thereof; however, the disclosure is not limited thereto. The second electrode layer 282 may be disposed at another region of the first semiconductor layer 260 excluding the upper surface of the first semiconductor layer 260; however, the disclosure is not limited thereto.

The second electrode layer 282 may be formed of an conductive material, such as In, Co, Si, Ge, Au, Pd, Pt, Ru, Re, Mg, Zn, Hf, Ta, Rh, Ir, W, Ti, Ag, Cr, Mo, Nb, Al, Ni, Cu, WTi or an alloy thereof, and may be formed to have a single layer or a plurality of layers;

Meanwhile, the light emitting structure 270 may include a third semiconductor layer (not shown) disposed on the first semiconductor layer 260 in a state in which the third semiconductor layer (not shown) has a polarity opposite to that of the first semiconductor layer 260. Also, the second semiconductor layer 230 may be realized as an n type semiconductor layer, and the first semiconductor layer 260 may be realized as a p type semiconductor layer. As a result, the light emitting structure 270 may have at least one selected from among N-P, P-N, N-P-N and P-N-P junction structures.

A light extraction structure 284 may be formed at the upper part of the light emitting structure 270.

The light extraction structure 284 may be formed at the upper surface of the first semiconductor layer 260 or may be formed at the upper part of a light transmitting electrode layer (not shown), which is formed at the upper part of the light emitting structure 270; however, the disclosure is not limited thereto.

The light extraction structure 284 may be partially or completely formed at the upper surface of the first semiconductor layer 260 or the light transmitting electrode layer (not shown). The light extraction structure 284 may be formed at least a portion of the upper surface of the first semiconductor layer 260 or the light transmitting electrode layer (not shown) by etching; however, the disclosure is not limited thereto. Wet etching and/or dry etching may be used as the etching process. As the result of etching, roughness, forming the light extraction structure 284, may be provided at the upper surface of the light transmitting electrode layer (not shown) or at the upper surface of the first semiconductor layer 260. The roughness may be irregularly formed with a random size; however, the disclosure is not limited thereto. The roughness may include at least one selected from among a texture pattern, an irregular pattern and an uneven pattern.

The roughness may be formed in various shapes, such as a cylinder, a multilateral pillar, a circular cone, a multilateral cone, a truncated circular cone and a truncated multilateral cone, in side section.

Meanwhile, the light extraction structure 284 may be formed by photo electro chemical etching (PEC); however, the disclosure is not limited thereto. As the light extraction structure 284 is formed at the upper surface of the light transmitting electrode layer (not shown) or the first semiconductor layer 260, light emitted from the active layer 250 may be prevented from being totally reflected by the upper surface of the light transmitting electrode layer (not shown) or the first semiconductor layer 260 and reabsorbed or scattered, thereby contributing to improvement of light extraction efficiency of the light emitting device 200.

A passivation layer (not shown) may be formed at the lateral surface of the upper surface of the light emitting structure 270. The passivation layer (not shown) may be formed of an insulative material.

Figure 9:
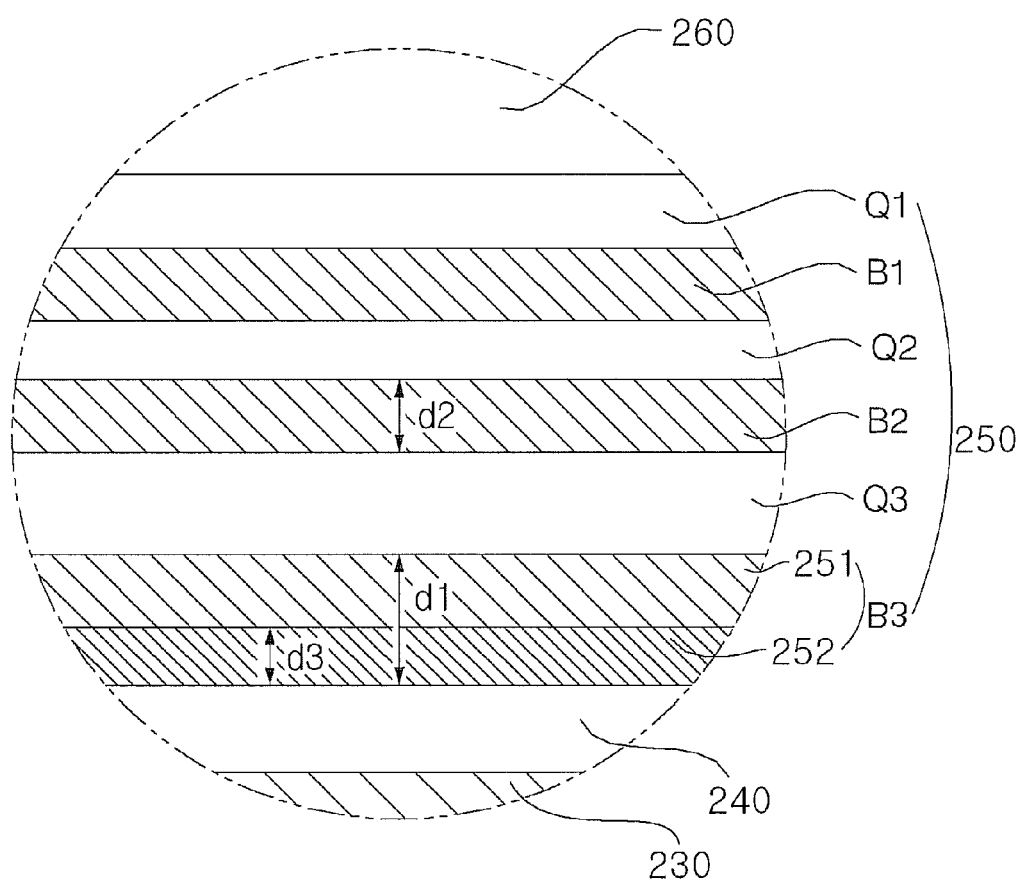
FIG. 9 is a partially enlarged sectional view of the light emitting device according to the embodiment.

FIG. 9 is an enlarged sectional view of a region B of FIG. 8.

Referring to FIG. 9, the active layer 250 of the light emitting device 200 may have a multi quantum well structure. Consequently, the active layer 250 may include first to third well layers Q1, Q2 and Q3 and first to third barrier layers B1, B2 and B3.

According to embodiments, the first to third well layers Q1, Q2 and Q3 and the first to third barrier layers B1, B2 and B3 may be alternately stacked as shown in FIG. 9.

In FIG. 9, the first to third well layers Q1, Q2 and Q3 and the first to third barrier layers B1, B2 and B3 are formed so that the first to third well layers Q1, Q2 and Q3 and the first to third barrier layers B1, B2 and B3 are alternately stacked; however, the disclosure is not limited thereto. The number of the well layers and the barrier layers may be varied, and the well layers Q1, Q2 and Q3 and the barrier layers B1, B2 and B3 may be arbitrarily arranged. In addition, the materials for the well layers Q1, Q2 and Q3 and the barrier layers B1, B2 and B3 may have different composition ratios, and the well layers Q1, Q2 and Q3 and the barrier layers B1, B2 and B3 may have different band gaps and thicknesses. That is, the composition ratios of the materials for the well layers Q1, Q2 and Q3 and the barrier layers B1, B2 and B3 and the band gaps and thicknesses of the well layers Q1, Q2 and Q3 and the barrier layers B1, B2 and B3 are not limited as shown in FIG. 9.

Also, according to embodiments, the third barrier layer B3 formed adjacent to the second semiconductor layer 230 doped with the p type dopant may have a thickness d1, and the first and second barrier layers B1 and B2 may have a thickness d2. Here, d1 may be greater than d2.

Meanwhile, the third barrier layer B3 may include a first layer 251 and a second layer 252 disposed between the first layer 251 and the intermediate layer 240.

The first layer 251 and the second layer 252 may have different growth conditions, thicknesses or compositions; however, the disclosure is not limited thereto. For example, the second layer 252 may have In content greater than that of the first layer 251 and less than that of each of the well layers.

Meanwhile, the second layer 252 may be doped with a p type dopant such as Mg. As the second layer 252 is doped with such a p type dopant, hole injection efficiency may be improved, and operating voltage may be lowered.

Meanwhile, the second layer 252 may have a predetermined thickness d3 to increase hole capture probability. For example, the second layer 252 may have a thickness of 2 nm to 15 nm.

Also, the first layer 251 and the second layer 252 may be formed so as to have different band gaps, which will be hereinafter described with reference to FIG. 10.

Figure 10:
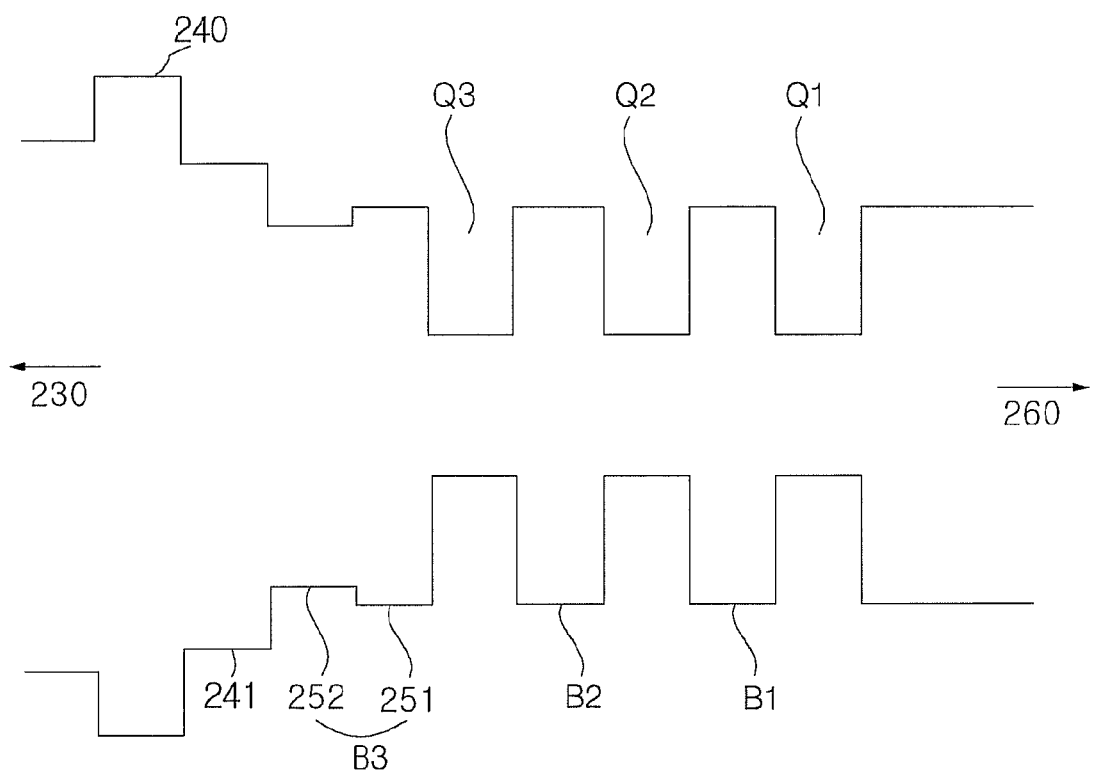
FIG. 10 is a view showing an energy band diagram of the light emitting device according to the embodiment.

FIG. 10 is a view showing an energy band diagram of the light emitting device according to the embodiment.

Referring to FIG. 10, the first layer 251 and the second layer 252 of the third barrier layer B3 may have different band gaps. For example, the band gap of the second layer 252 may be formed to have a cart structure, by which the band gap of the second layer 252 is less than that of the first layer 251. Also, the band gap of the second layer 252 may be less than that of each of the first and second barrier layers B1 and B2 and that of the first layer 251 of the third barrier layer B3 and greater than that of each of the well layers Q1, Q2 and Q3.

Meanwhile, if the thicknesses of the well layers Q1, Q2 and Q3, functioning as light emitting layers, are increased, carrier capture probability may be increased. However, if the thicknesses of the well layers Q1, Q2 and Q3 are increased, the quantum well structure may be deeply distorted due to piezoelectric polarization with the result that internal quantum efficiency is lowered and red shift of a light emitting spectrum occurs, thereby deteriorating electrical and optical properties of the light emitting device to emit light through recombination between electrons and holes.

In the light emitting device according to the embodiment, one portion of each of the barrier layers B1, B2 and B3, not functioning as light emitting layers, may be formed so as to have a band gap less than the other portion of each of the barrier layers B1, B2 and B3 and to have a cart structure contributing to capture of carriers. As a result, carrier injection efficiency may be improved without poor spectrum of light and curve of bands generated in the well layers Q1, Q2 and Q3. Consequently, carrier injection efficiency may be improved, and probability of recombination between holes and electrons may be increased, thereby improving light emission efficiency of the light emitting device.

Meanwhile, holes have lower mobility than electrons. For this reason, the electrons may be excessively injected as compared with the holes (an excessive electron injection phenomenon). Also, the electrons may flow to the first semiconductor layer 260 over the active layer 240 (an overflowing phenomenon).

Also, the third barrier layer B3 adjacent to the second semiconductor layer 230 doped with the p type dopant may be formed to have a cart structure, thereby increasing capture probability of carriers, e.g. holes, supplied from the second semiconductor layer 230. Consequently, probability of recombination between electrons and holes may be increased, an overflowing phenomenon, in which electrons supplied from the second semiconductor layer 230 flows to the first semiconductor layer 260 due to excessive injection of the electrons, may be prevented, thereby improving light emission efficiency of the light emitting device 100.

Figure 11:
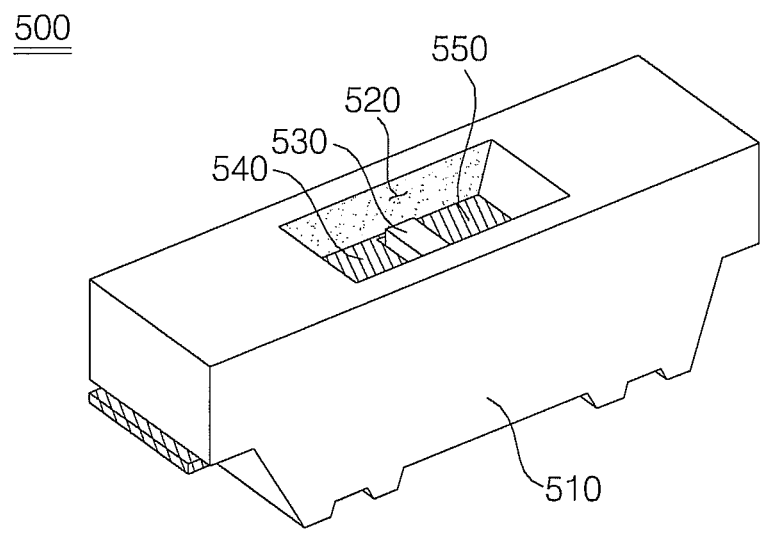
FIG. 11 is a perspective view showing a light emitting device package including a light emitting device according to an embodiment.
Figure 12:
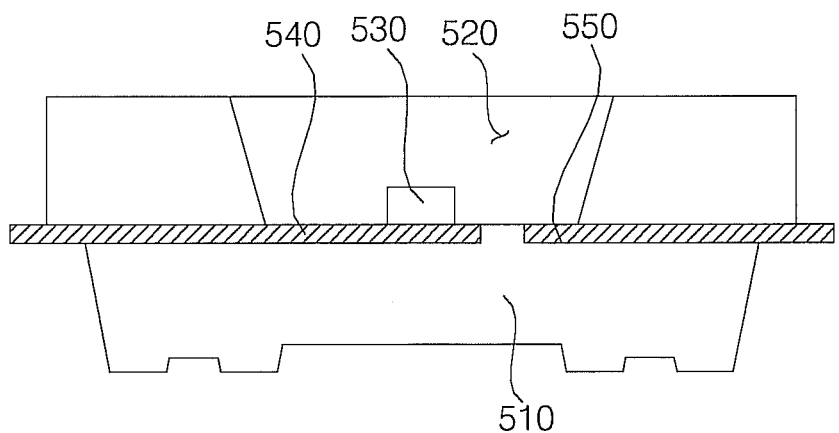
FIG. 12 is a sectional view of the light emitting device package including the light emitting device according to the embodiment.
Figure 13:
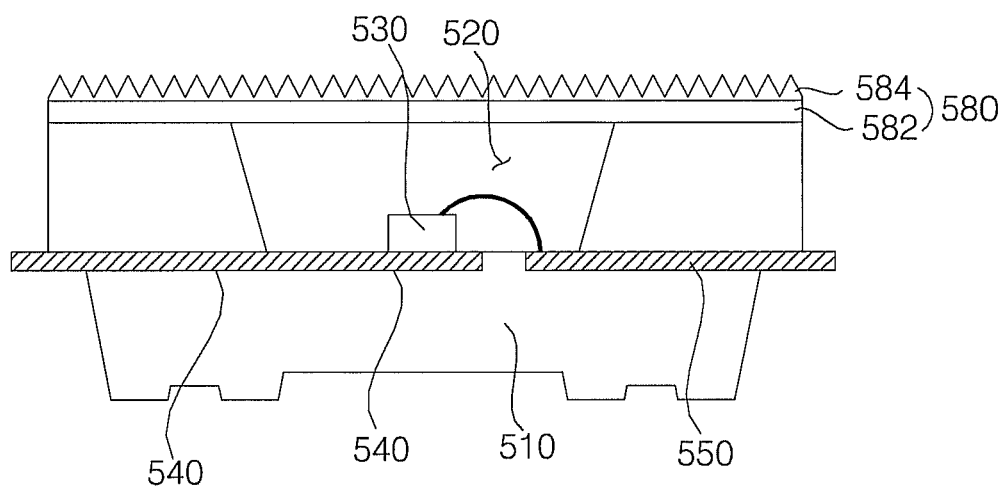
FIG. 13 is a sectional view of the light emitting device package including the light emitting device according to the embodiment.

FIGS. 11 to 13 are a perspective view and sectional views showing a light emitting device package 500 according to an embodiment.

Referring to FIGS. 11 to 13, the light emitting device package 500 includes a package body 510 having a cavity 520, first and second lead frames 540 and 550 mounted at the package body 510, a light emitting device 530 electrically connected to the first and second lead frames 540 and 550, and an encapsulant (not shown) filled in the cavity 520 to cover the light emitting device 530.

The package body 510 may be formed of at least one selected from among a resin material such as polyphthalamide (PPA), silicon (Si), aluminum (Al), aluminum nitride (AlN), liquid crystal polymer, photo sensitive glass (PSG), polyamide 9T (PA9T), syndiotactic polystyrene (SPS), a metallic material, a sapphire (Al2O3), beryllium oxide (BeO), and a printed circuit board (PCB). The package body 510 may be formed by injection molding or etching; however, the disclosure is not limited thereto.

An incline plane may be formed at the inner surface of the package body 510. A reflection angle of light emitted from the light emitting device 530 may vary based on an inclination angle of the incline plane, thereby adjusting a viewing angle of light emitted outward.

If a viewing angle of light decreases, concentration of light emitted from the light emitting device 530 increases. On the other hand, if a viewing angle of light increases, concentration of light emitted from the light emitting device 530 decreases.

Meanwhile, the cavity 520 formed in the package body 510 may be formed in a circular shape, a quadrangular shape, a polygonal shape or an oval shape when viewed from above, and, in particular, the edge of the cavity 520 may be curved; however, the disclosure is not limited thereto.

The light emitting device 530 may be mounted on the first lead frame 540. For example, the light emitting device 530 may be a light emitting device to emit red, green, blue or white light or an ultraviolet (UV) light emitting device to emit UV light; however, the disclosure is not limited thereto. Also, a plurality of light emitting devices 530 may be mounted on the first lead frame 540.

Also, the light emitting device 530 may be a horizontal type light emitting device in which electrical terminals are formed at the upper surface of the light emitting device 530, a vertical type light emitting device in which electrical terminals are formed at the upper and lower surfaces of the light emitting device, respectively, or a flip chip type light emitting device.

Meanwhile, in the light emitting device package 500 according to the embodiment, the light emitting device 530 may have electrodes (not shown) extending from the side of the light emitting device 530 so that operating voltage is lowered and light emitting efficiency is improved, thereby improving luminous intensity of the light emitting device package 500.

The encapsulant (not shown) may be filled in the cavity 520 so as to cover the light emitting device 530.

The encapsulant (not shown) may be formed of a resin material, such as silicone or epoxy. The resin material may be filled in the cavity 520 and may be UV or thermally cured to form the encapsulant (not shown).

Also, the encapsulant (not shown) may include a fluorescent substance. The kind of the fluorescent substance may be selected based on the wavelength of light emitted from the light emitting device 530 so that the light emitting device package 500 emits white light.

Based on the wavelength of light emitted from the light emitting device 530, the fluorescent substance may be one selected from among a blue light emitting fluorescent substance, a blue light emitting fluorescent substance, a bluish green light emitting fluorescent substance, a green light emitting fluorescent substance, a yellowish green light emitting fluorescent substance, a yellow light emitting fluorescent substance, a yellowish red light emitting fluorescent substance, an orange light emitting fluorescent substance and a red light emitting fluorescent substance.

That is, the fluorescent substance may be excited by first light emitted from the light emitting device 530 to generate second light. For example, if the light emitting device 530 is a blue light emitting diode and the fluorescent substance is a yellow fluorescent substance, the yellow fluorescent substance may be excited by the blue light to emit yellow light, and the blue light generated from the blue light emitting diode and the yellow light excited by the blue light may be mixed. As a result, the light emitting device package 500 emits white light.

In a similar manner, if the light emitting device 530 is a green light emitting diode, a magenta fluorescent substance or blue and red fluorescent substances may be mixed. Also, if the light emitting device 530 is a red light emitting diode, a cyan fluorescent substance or blue and green fluorescent substances may be mixed.

The fluorescent substances may be well-known fluorescent substances, such as a YAG fluorescent substance, a TAG fluorescent substance, a sulfide fluorescent substance, a silicate fluorescent substance, an aluminate fluorescent substance, a nitride fluorescent substance, a carbide fluorescent substance, a nitridosilicate fluorescent substance, a borate fluorescent substance, a fluoride fluorescent substance, and a phosphate fluorescent substance.

The first and second lead frames 540 and 550 may be formed of at least one selected from among titanium (Ti), copper (Cu), nickel (Ni), gold (Au), chrome (Cr), tantalum (Ta), platinum (Pt), tin (Sn), silver (Ag), phosphorus (P), aluminum (Al), indium (In), palladium (Pd), cobalt (Co), silicon (Si), germanium (Ge), hafnium (Hf), ruthenium (Ru) and iron (Fe) or an alloy thereof. Also, the first and second lead frames 540 and 550 may have a single layer structure or a multi layer structure; however, the disclosure is not limited thereto.

The first and second lead frames 540 and 550 are spaced apart from each other so that the first and second lead frames 540 and 550 are electrically isolated from each other. The light emitting device 530 is mounted on the first and second lead frames 540 and 550. The first and second lead frames 540 and 550 may directly contact the light emitting device 530 or may be electrically connected to the light emitting device 530 via a conductive material, such as a soldering member (not shown). Also, the light emitting device 530 may be electrically connected to the first and second lead frames 540 and 550 by wire bonding; however, the disclosure is not limited thereto. When power is supplied to the first and second lead frames 540 and 550, therefore, the power may be applied to the light emitting device 530. On the other hand, a plurality of lead frames (not shown) may be mounted in the package body 510, and the respective lead frames (not shown) may be electrically connected to the light emitting device 530; however, the disclosure is not limited thereto.

Meanwhile, referring to FIG. 13, the light emitting device package 500 according to the embodiment may further include an optical sheet 580. The optical sheet 380 may include a base 582 and a prism pattern 584.

The base 582 is a support member to form the prism pattern 584. The base 582 may be formed of a transparent material exhibiting high thermal stability. For example, the base 582 may be formed of any one selected from a group consisting of polyethylene terephthalate, polycarbonate, polypropylene, polyethylene, polystyrene and a polyepoxy; however, the disclosure is not limited thereto.

Also, the base 582 may include a fluorescent substance (not shown). For example, a fluorescent substance (not shown) may be uniformly distributed in a material for the base 582, and a mixture may be cured to form the base 582. When the base 582 is formed as described above, the fluorescent substance (not shown) may be uniformly distributed in the base 582.

Meanwhile, the three-dimensional prism pattern 584 to refract and condense light may be formed on the base 582. A material for the prism pattern 584 may be an acryl resin; however, the disclosure is not limited thereto.

The prism pattern 584 may include a plurality of linear prisms arranged in parallel in a state in which the linear prisms are adjacent to each other at one surface of the base 582 in one direction. Each of the linear prisms may be configured in the vertical sectional shape of a triangle in the axial direction thereof.

The prism pattern 584 condenses light. When the optical sheet 580 is attached to the light emitting device package 500 of FIG. 13, therefore, straightforwardness of light may be improved, thereby improving luminous intensity of the light emitting device package 500.

Meanwhile, the prism pattern 584 may include a fluorescent substance (not shown).

A fluorescent substance (not shown) may be mixed with a material, e.g. an acryl resin, for the prism pattern 584 in a distributed state into paste or slurry, and the prism pattern 584 is formed with the paste or slurry. Consequently, the fluorescent substance (not shown) may be uniformly distributed in the prism pattern 584.

In a case in which the fluorescent substance (not shown) is included in the prism pattern 584 as described above, light uniformity and distribution of the light emitting device package 500 may be improved, and, in addition, a viewing angle of the light emitting device package 500 may be improved based on light condensation of the prism pattern 584 and light dispersion of the fluorescent substance (not shown).

A plurality of light emitting device packages 500 according to the embodiment may be arranged on a board. An optical member, such as a light guide plate, a prism sheet or a diffusion sheet, may be disposed on an optical path of each of the light emitting device packages 500. The light emitting device packages, the board, and the optical members may function as a light unit. In other embodiments, a display apparatus, indication apparatus and lighting system including the light emitting device or the light emitting device package according to one of the previous embodiments may be realized. For example, the lighting system may include a lamp and a streetlight.

Figure 14:
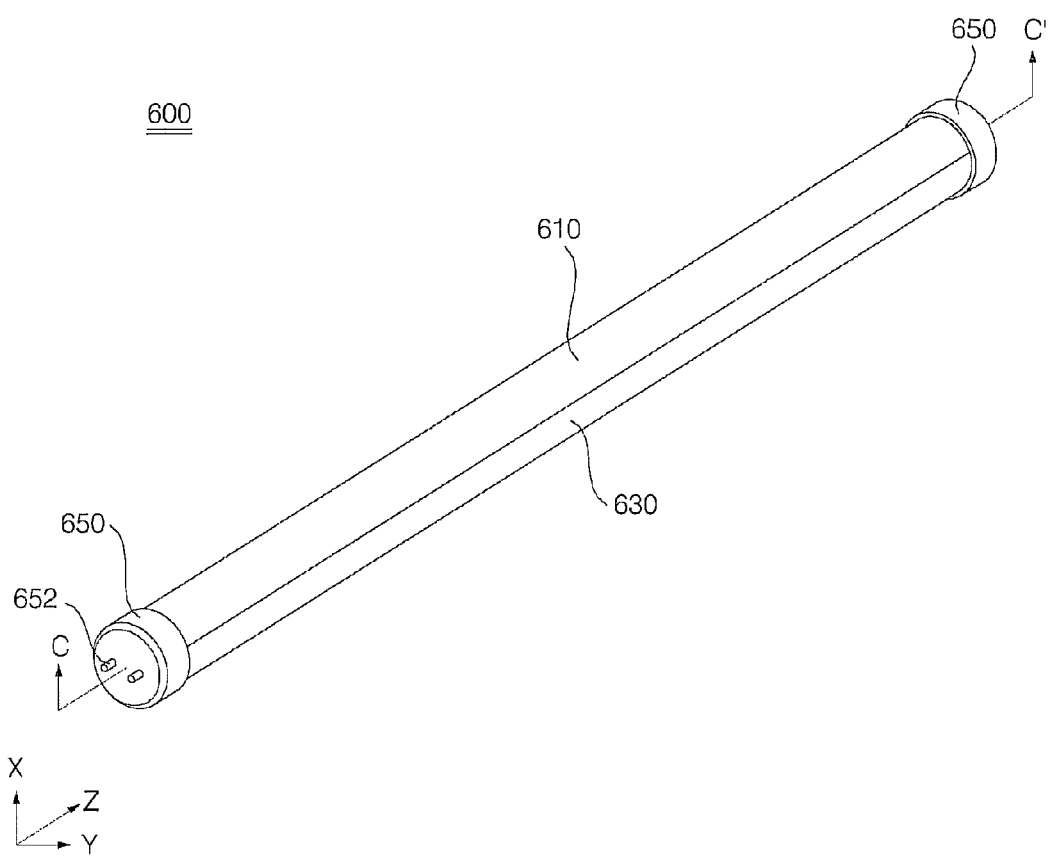
FIG. 14 is a perspective view showing a lighting system including a light emitting device according to an embodiment.
Figure 15:
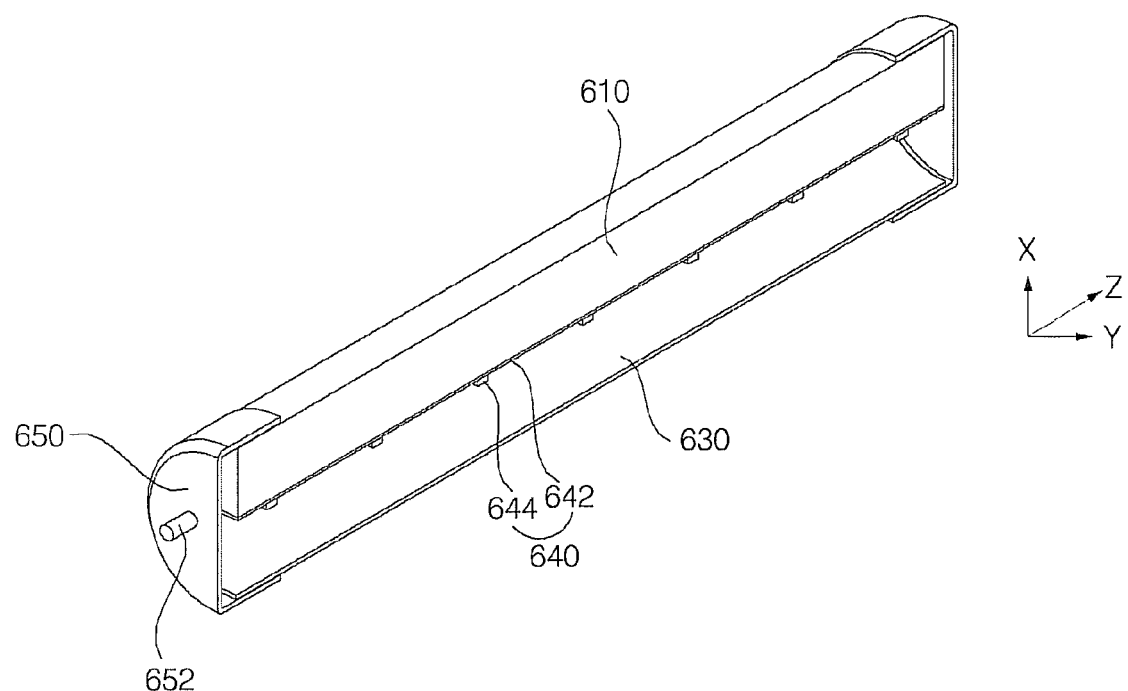
FIG. 15 is a sectional view taken along line C-C' of FIG. 14.

FIG. 14 is a perspective view showing a lighting apparatus 600 including a light emitting device package according to an embodiment, and FIG. 15 is a sectional view taken along line C-C' of FIG. 14.

Referring to FIGS. 14 and 15, the lighting apparatus 600 may include an apparatus body 610, a cover 630 fastened to the apparatus body 610, and closing caps 650 provided at opposite ends of the apparatus body 610.

A light emitting device module 640 is fastened to the lower surface of the apparatus body 610. The apparatus body 610 may be formed of a metallic material exhibiting high conductivity and heat dissipation to discharge heat generated from light emitting device packages 644 outward through the upper surface of the apparatus body 610.

Several color light emitting device packages 644 may be mounted on a printed circuit board (PCB) 642 at several rows to constitute an array. The light emitting device packages 644 may be mounted on the PCB 642 at the same interval or at various intervals as needed so as to adjust brightness of the lighting apparatus 600. A metal core PCB (MPPCB) or a PCB formed of an FR4 material may be used as the PCB 642.

In particular, each of the light emitting device packages 644 may include a light emitting device (not shown). In the embodiment, the light emitting device (not shown) may have electrodes (not shown) extending from the side of the light emitting device (not shown) so that operating voltage is lowered and light emitting efficiency is improved, thereby improving luminous intensity of the light emitting device packages 644 and thus the lighting apparatus 600.

The cover 630 may be formed in a circular shape to enclose the lower surface of the apparatus body 610; however, the disclosure is not limited thereto.

The cover 630 protects the light emitting device module 640 from external foreign matter. Also, the cover 630 may include diffusion particles to prevent glare and to uniformly discharge light outward. In addition, a prism pattern may be formed at the inner surface and/or the outer surface of the cover 630. Also, a florescent substance may be applied to the inner surface and/or the outer surface of the cover 630.

Meanwhile, light generated from the light emitting device packages 644 is discharged outward through the cover 630. For this reason, it is necessary for the cover 630 to exhibit high light transmissivity and heat resistance sufficient to endure heat generated from the light emitting device packages 644. The cover 630 may be formed of a material including polyethylene terephthalate (PET), polycarbonate (PC) or polymethyl methacrylate (PMMA).

The closing caps 350 may be provided at the opposite ends of the apparatus body 610 to cover a power supply unit (not shown). Also, power pins 652 are formed at each of the closing caps 650. Consequently, the lighting apparatus 600 according to the embodiment may be directly connected to a terminal, from which the existing fluorescent lamp is removed, without using an additional connection member.

Figure 16:
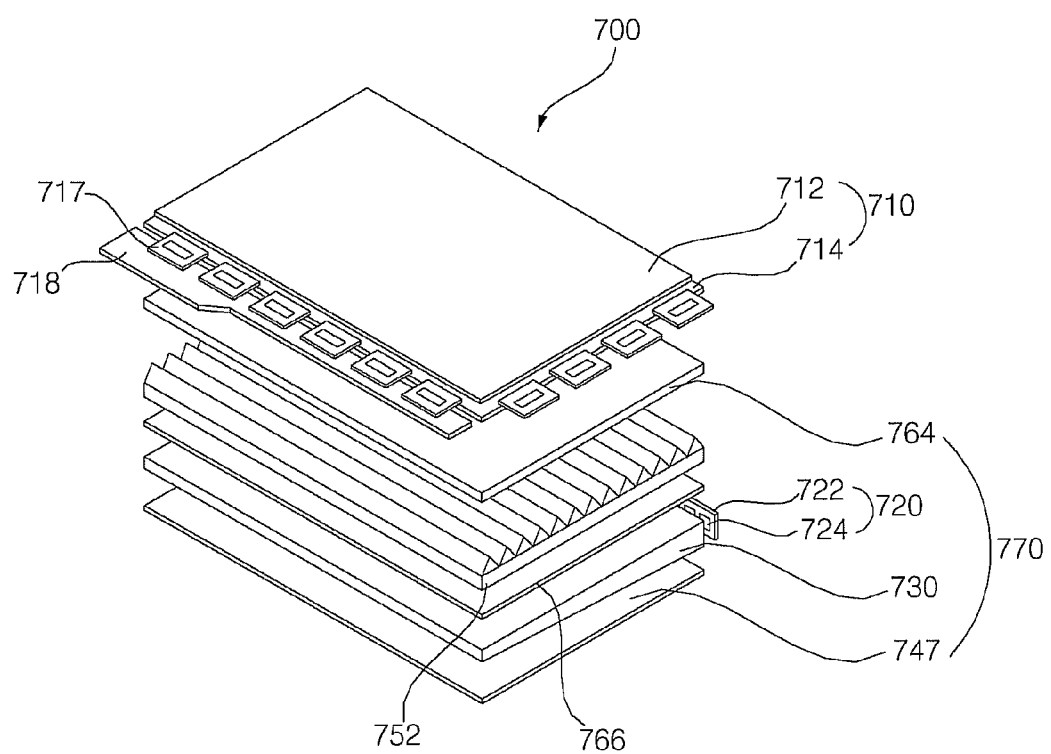
FIG. 16 is an exploded perspective view showing a liquid crystal display apparatus including a light emitting device according to an embodiment.

FIG. 16 is an exploded perspective view showing a liquid crystal display apparatus 700 including a light emitting device according to an embodiment.

Referring to FIG. 16, the liquid crystal display apparatus 700 may include a liquid crystal display panel 710 and an edge light type backlight unit 770 to supply light to the liquid crystal display panel 710.

The liquid crystal display panel 710 may display an image using light emitted from the backlight unit 770. The liquid crystal display panel 710 may include a color filter substrate 712 and a thin film transistor substrate 714 disposed opposite to each other in a state in which a liquid crystal is disposed between the color filter substrate 712 and the thin film transistor substrate 714.

The color filter substrate 712 may realize colors of the image displayed through the liquid crystal display panel 710.

The thin film transistor substrate 714 is electrically connected to a printed circuit board 718, on which a plurality of circuit parts is mounted, via drive films 717. The thin film transistor substrate 714 may apply drive voltage supplied from the printed circuit board 718 to the liquid crystal in response to a drive signal provided by the printed circuit board 718.

The thin film transistor substrate 714 may include a thin film transistor and a pixel electrode formed on another transparent substrate, such as glass or plastic.

The backlight unit 770 includes a light emitting device module 720 to emit light, a light guide plate 730 to change the light emitted from the light emitting device module 720 into surface emission light and to provide the surface emission light to the liquid crystal display panel 710, a plurality of films 750, 766 and 764 to uniformalize brightness distribution of the light provided from the light guide plate 730, thereby improving vertical incidence of light, and a reflective sheet 740 to reflect light emitted to the rear of the light guide plate 730 to the light guide plate 730.

The light emitting device module 720 may include a plurality of light emitting device packages 724 and a PCB 722 on which the light emitting device packages 724 are mounted to constitute an array.

In particular, each of the light emitting device packages 744 may include a light emitting device (not shown). In the embodiment, the light emitting device (not shown) may have electrodes (not shown) extending from the side of the light emitting device (not shown) so that operating voltage is lowered and light emitting efficiency is improved, thereby improving luminous intensity of the light emitting device packages 744 and thus the backlight unit 770.

Meanwhile, the backlight unit 770 may further include a diffusion film 566 to diffuse the light emitted from the light guide plate 730 toward the liquid crystal display panel 710 and a prism film 750 to condense the diffused light, thereby improving vertical incidence of light. Also, the backlight unit 770 may further include a protection film 764 to protect the prism film 750.

Figure 17:
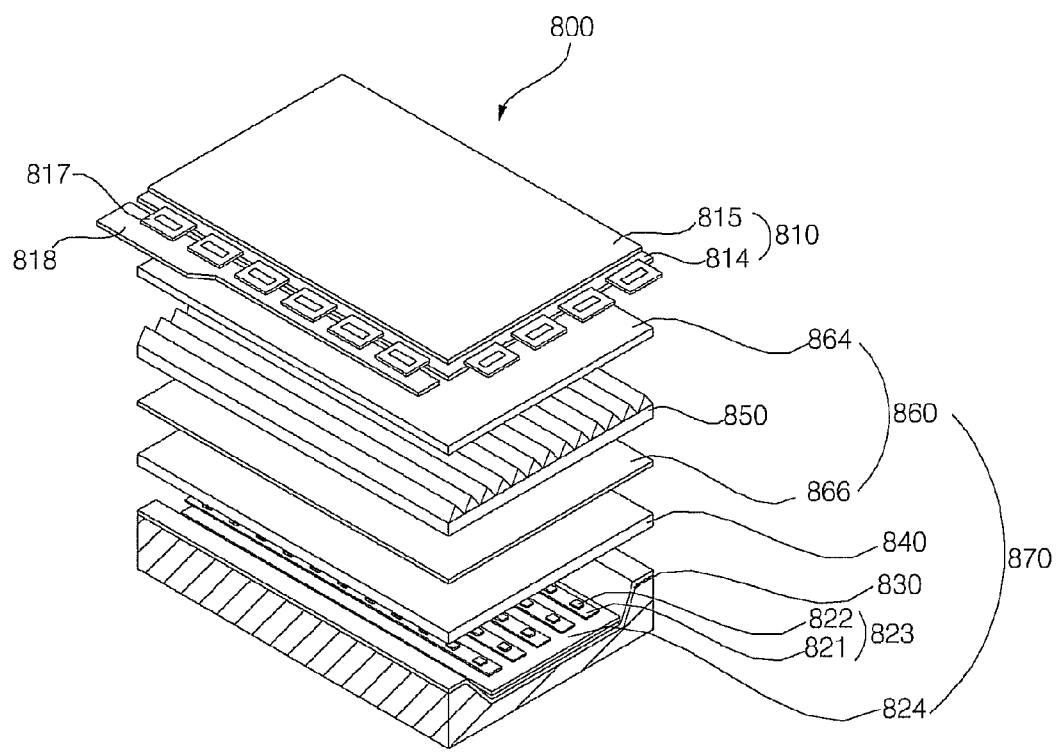
FIG. 17 is an exploded perspective view showing a liquid crystal display apparatus including a light emitting device according to another embodiment.

FIG. 17 is an exploded perspective view showing a liquid crystal display apparatus 800 including a light emitting device according to another embodiment. However, parts shown in FIG. 16 and described with reference to FIG. 16 will not be described in detail.

Referring to FIG. 17, the liquid crystal display apparatus 800 may include a liquid crystal display panel 810 and a direct type backlight unit 870 to supply light to the liquid crystal display panel 810.

The liquid crystal display panel 810 is identical to the liquid crystal display panel 710 of FIG. 16, and therefore, a detailed description thereof will not be given.

The backlight unit 870 may include a plurality of light emitting device modules 823, a reflective sheet 824, a lower chassis 830 in which the light emitting device modules 823 and the reflective sheet 824 are disposed, a diffusion plate 840 disposed above the light emitting device modules 823, and a plurality of optical films 860.

Each of the light emitting device modules 823 may include a PCB 821 on which on which a plurality of light emitting device packages 822 is mounted to constitute an array.

In particular, each of the light emitting device packages 822 may include a light emitting device (not shown). In the embodiment, the light emitting device (not shown) may have electrodes (not shown) extending from the side of the light emitting device (not shown) so that operating voltage is lowered and light emitting efficiency is improved, thereby improving luminous intensity of the light emitting device packages 744822 and thus the backlight unit 870.

The reflective sheet 824 reflects light emitted from the light emitting device packages 822 toward the liquid crystal display panel 810, thereby improving luminous efficacy.

Meanwhile, light emitted from the light emitting device modules 823 is incident upon the diffusion plate 840. The optical films 860 are disposed above the diffusion plate 840. The optical films 860 may include a diffusion film 866, a prism film 850, and a protection film 864.

As is apparent from the above description, the light emitting devices according to the embodiments have the effects of improving hole injection efficiency of the active layer and thus improving light emission efficiency.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising a light emitting structure comprising: a first semiconductor layer; a second semiconductor layer; an active layer disposed between the first semiconductor layer and the second semiconductor layer; and undoped $Al_yGa_{1-y}N$ ($0<x\le 1$) disposed between the active layer and the second semiconductor layer, wherein
the first semiconductor layer is an N type semiconductor layer doped with an N type dopant,
the second semiconductor layer is a P type semiconductor layer doped with a P type dopant,
the active layer comprises at least one pairs of alternately stacked well layers and barrier layers,
one of the barrier layers adjacent to the second semiconductor layer comprises a first layer and a second layer disposed between the first layer and the second semiconductor layer,
the first layer has a first band gap,
the second layer has a second band gap,
the second band gap is less than the first band gap,
the second layer is doped with a P type dopant,
wherein the first layer and the second layer include In, and the second layer has In content greater than that of the first layer.

2. The light emitting device according to claim 1, wherein each of the well layers has a third band gap, and the second band gap is greater than the third band gap.

3. The light emitting device according to claim 1, wherein the second layer has a thickness of 2 nm to 15 nm.

4. The light emitting device according to claim 1, wherein the band gap of the undoped $Al_yGa_{1-y}N$ ($0<x\le 1$) is greater than the first band gap.

5. The light emitting device according to claim 1, wherein the first layer has a thickness of 4 nm to 6 nm.

6. The light emitting device according to claim 1, wherein the second layer is doped with a Mg (magnesium) and has a concentration of the Mg of 1E19 atoms/cm$^3$ to 5E19 atoms/cm$^3$.

7. The light emitting device according to claim 1, further comprising:
a support substrate disposed under the second semiconductor layer;
a first electrode disposed between the support substrate and the second semiconductor layer; and
a second electrode disposed on the first semiconductor layer.

8. A light emitting device comprising a light emitting structure comprising: a first semiconductor layer; a second semiconductor layer; and an active layer disposed between the first semiconductor layer and the second semiconductor layer, wherein
the first semiconductor layer is an N type semiconductor layer doped with an N type dopant,
the second semiconductor layer is a P type semiconductor layer doped with a P type dopant,
the active layer comprises at least one pairs of alternately stacked well layers and barrier layers,
one of the barrier layers adjacent to the second semiconductor layer comprises a first layer and a second layer disposed between the first layer and the second semiconductor layer,
the first layer has a first band gap,
the second layer has a second band gap,
the second band gap is less than the first band gap,
the second layer is doped with a P type dopant,
the light emitting device further comprises an intermediate layer disposed between the active layer and the second semiconductor layer,
the intermediate layer comprises a p type doped $p-Al_xGa_{1-x}N$ ($0<x\le 1$),
the intermediate layer is a bulk layer, and
Al composition of the intermediate layer is varied, and
wherein the first layer and the second layer include In, and the second layer has In content greater than that of the first layer.

9. The light emitting device according to claim 8, wherein the intermediate layer has a band gap greater than those of the well layer.

10. The light emitting device according to claim 8, wherein the Al composition of the intermediate layer is increased and then decreased from the active layer to the second semiconductor layer.

11. The light emitting device according to claim 8, wherein the Al composition of the intermediate layer is gradually increased and then gradually decreased from the active layer to the second semiconductor layer.

12. The light emitting device according to claim 8, wherein the intermediate layer is doped with In.

13. The light emitting device according to claim 8, wherein the intermediate layer has a thickness of 300 Å to 600 Å.

14. The light emitting device according to claim 8, wherein the intermediate layer has an Al composition ratio varied between 5% and 30%.

* * * * *